US008426239B2

(12) United States Patent  (10) Patent No.: US 8,426,239 B2
Peeters  (45) Date of Patent: Apr. 23, 2013

(54) METHOD OF MANUFACTURING LACQUER USING INKJET PRINTING

(76) Inventor: Patrick Peeters, New Delhi (IN)

( * ) Notice: Subject to any disclaimer, the term of this patent is extended or adjusted under 35 U.S.C. 154(b) by 0 days.

(21) Appl. No.: 13/348,716

(22) Filed: Jan. 12, 2012

(65) Prior Publication Data

US 2012/0184087 A1  Jul. 19, 2012

(51) Int. Cl.
*H01L 21/00*  (2006.01)

(52) U.S. Cl.
USPC ................... 438/71; 438/29; 438/69

(58) Field of Classification Search ........... 438/29, 438/30, 31, 32, 69, 70, 71, 72
See application file for complete search history.

(56) References Cited

U.S. PATENT DOCUMENTS

| 6,350,945 | B1 * | 2/2002 | Mizuno | 136/246 |
| 7,238,878 | B2 * | 7/2007 | Gonsiorawski | 136/246 |
| 2001/0015221 | A1 * | 8/2001 | Kubota et al. | 136/256 |
| 2012/0167970 | A1 * | 7/2012 | Borg et al. | 136/256 |

* cited by examiner

*Primary Examiner* — Kevin M Picardat

(74) *Attorney, Agent, or Firm* — Antonio Papageorgiou; Ostrow Kaufman LLP

(57) ABSTRACT

A method of manufacturing a semiconductor device is provided. The method includes providing a transparent substrate having predefined active regions and non-active regions. Thereafter, the method includes spraying droplets of a lacquer on the predefined active regions to form corresponding lacquer layer regions, such that the non-active regions do not have presence of the lacquer. The lacquer layer regions are of a predefined thickness to enable their functional texturing. Texturing of lacquer layer enables light trapping or light extraction. Thereafter, one or more semiconductor layers are deposited o the lacquer layer regions and a cover substrate is provided. The cover substrate is joined to the transparent substrate at a portion of the non-active regions and encapsulates the lacquer layer regions and the one or more semiconductor layers between itself and the transparent substrate.

14 Claims, 12 Drawing Sheets

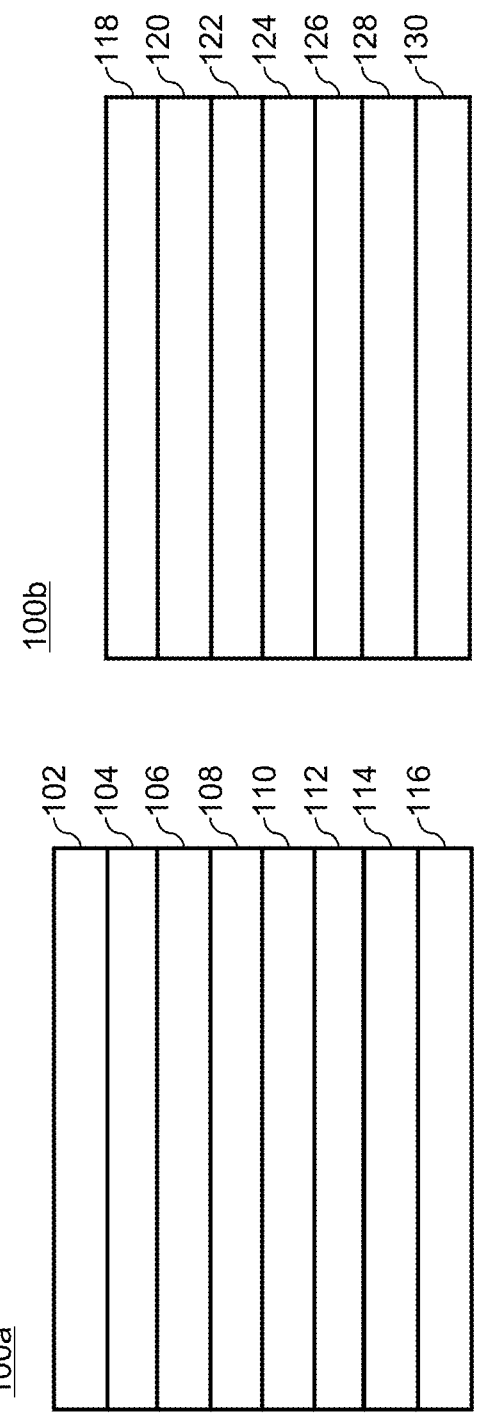

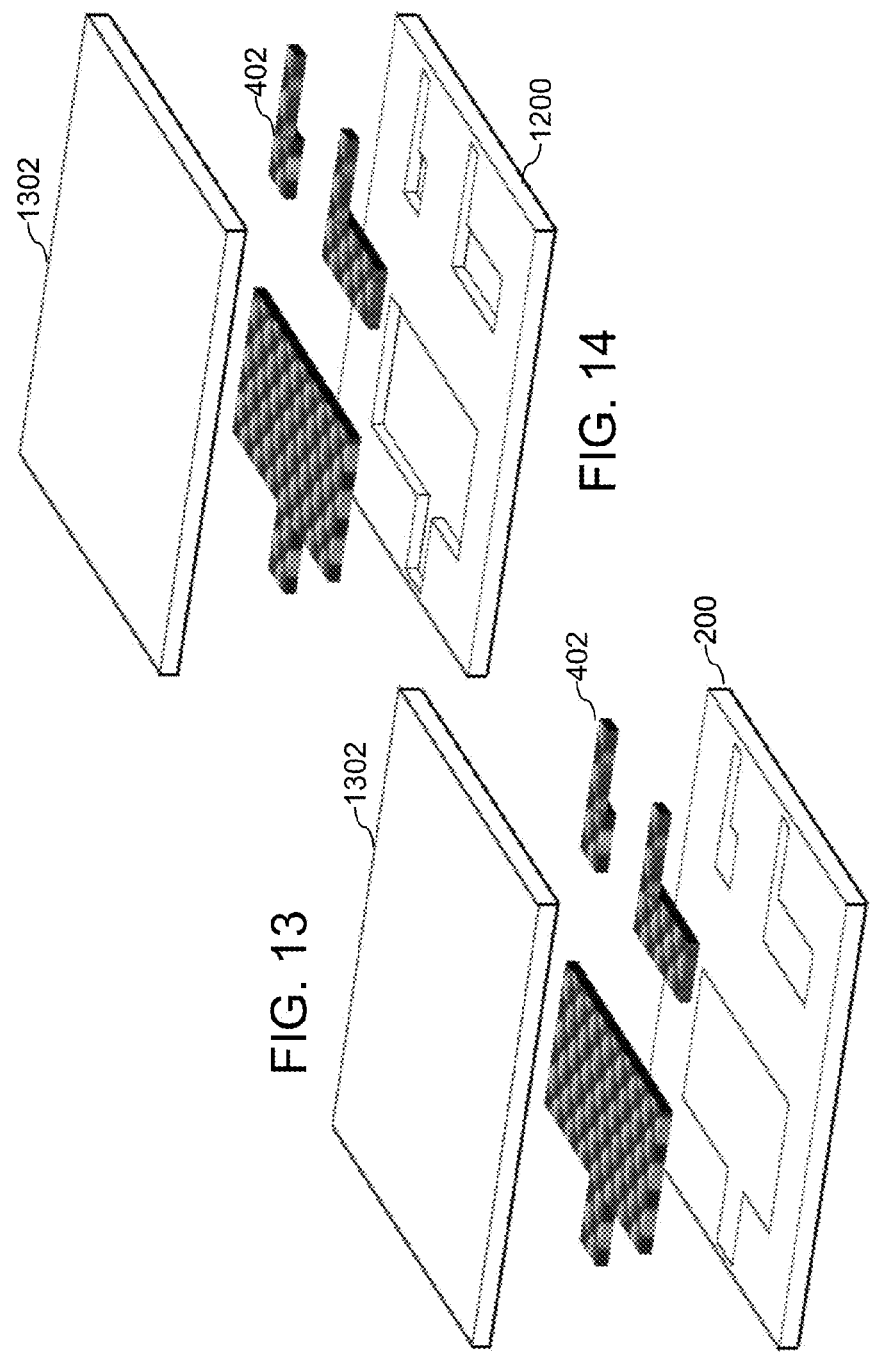

METHOD OF MANUFACTURING LACQUER USING INKJET PRINTING

INCORPORATION BY REFERENCE OF PRIORITY DOCUMENT

This application is based on, and claims the benefit of priority from Indian Patent Application No. 72/DEL/2011 entitled "METHOD OF MANUFACTURING LACQUER USING INKJET PRINTING" which was filed on Jan. 13, 2011. The content of the aforementioned application is incorporated by reference herein.

FIELD OF INVENTION

The invention disclosed herein relates, in general, to semiconductor devices. More specifically, the present invention relates to deposition of lacquer layers for the semiconductor devices.

BACKGROUND

In various semiconductor devices such as Organic Light Emitting Diodes (OLEDs) and Photovoltaic Devices (PVs), light management is a very critical aspect substantially affecting the efficiency of such devices. In OLEDs, the difference in refractive indices of ambient medium, substrate and deposited semiconductor layers can significantly reduce the percentage of generated light that can be extracted. Similarly in a PV device, light trapping is a major factor affecting its efficiency by increasing a path of light in the PV device thereby increasing its absorption. Therefore, lacquer layers with light management textures are added to such devices at the interfaces between different refractive index materials. For example, an OLED may have a light extraction texture on a lacquer layer deposited between the semiconductor layers and the substrate, and a PV device may also have light trapping texture on a lacquer layer deposited between the semiconductor layers and the substrate.

Although presence of lacquer is desirable for light trapping or light extraction at active areas of devices, i.e., semiconductor layers, its presence is highly undesirable at areas where substrate and an encapsulate join, and at areas where electrical contact tracks are deposited on the semiconductor layers. Any presence of lacquer in these areas may cause delamination or ingression of water or air through lacquer, causing corrosion and adversely hampering normal operation of device (OLED or PV device). In a worst case this may significantly reduce the lifetime of the device.

Currently, there are various methods to deposit the lacquer layers. In the current methods, the lacquer layer is deposited on the whole surface of the semiconductor layers or the substrates by spin coating, doctored blade, spray coating, screen printing, sputtering, glass mastering, photoresist mastering, electroforming, or chemical vapor deposition. Thereafter, the lacquer material is removed from the areas for electrical contacts and encapsulation contacts by etching or scribing.

However, these methods enable application of lacquer on the whole surface, followed by its removal from non-active areas. Accordingly, a significant amount of lacquer material that is removed gets wasted. Also, while removing the unwanted areas of the lacquer layer, the semiconductor or the substrate layer beneath the lacquer layer may get affected. For example, the substrate may also get scribed while scribing the lacquer layer.

Further, some particles of the scribed lacquer layer may get deposited again on the semiconductor layers or the substrate while scribing itself. Additionally, such methods may not be suitable for non-planar complex shapes. In light of the above discussion, there is a need for a method for deposition of lacquer.

BRIEF DESCRIPTION OF FIGURES

The features of the present invention, which are believed to be novel, are set forth with particularity in the appended claims. The invention may best be understood by reference to the following description, taken in conjunction with the accompanying drawings. These drawings and the associated description are provided to illustrate some embodiments of the invention, and not to limit the scope of the invention.

FIG. 1$a$ and 1$b$ illustrate a stack of layers in an exemplary OLED and an exemplary OPV, respectively, which provide an environment to implement the present invention;

FIG. 13 illustrates the use of a planarization layer when a transparent substrate without pockets for one or more predefined active regions is used; and FIG. 14 illustrates the use of a planarization layer when a transparent substrate with pockets for one or more predefined active regions is used.

Figure 3:
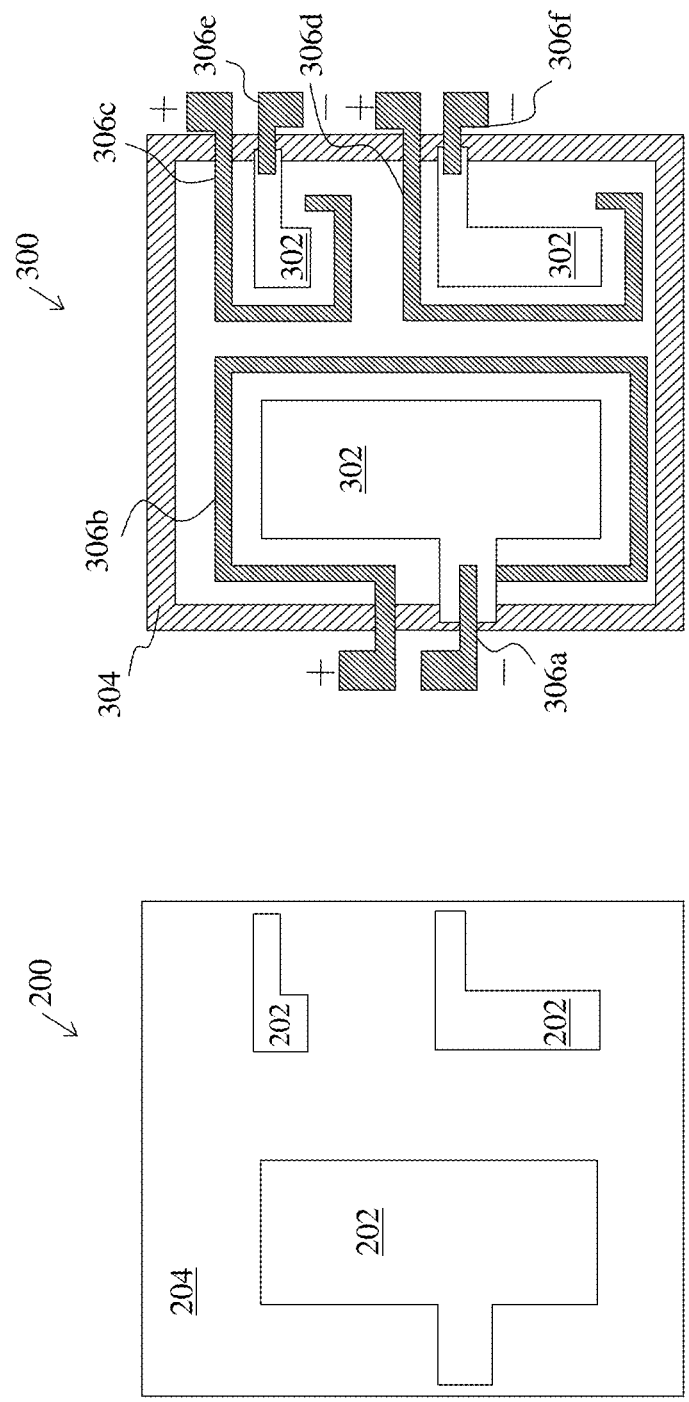
FIG. 3 shows the top view of an exemplary OLED without a cover substrate, in accordance with some embodiments of the present invention.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional structures described in the foregoing application that are not depicted on one of the described drawings. In the event such a structure is described, but not depicted in a drawing, the absence of such a drawing should not be considered as an omission of such design from the specification.

SUMMARY

The present invention provides a method of providing localized texture to facilitate light management in a semiconductor device, for example, light trapping in OPVs and light extraction in OLEDs. In an OLED, the method in accordance with the present invention includes depositing a lacquer material on active regions of a transparent substrate of the OLED by using ink-jet printing, followed by imprinting the texture on the lacquer regions by ultraviolet embossing, hot embossing, etching, stamping or scribing. In an embodiment of the invention the texture is inherently developed in the lacquer regions by controlled curing of the lacquer regions, thereby eliminating the need of a separate imprinting step.

In some embodiments, a method of manufacturing a semiconductor device is provided. The method includes providing a transparent substrate having one or more predefined active regions and one or more non-active regions. Thereafter, the method includes spraying droplets of a lacquer on the one or more predefined active regions such that the non-active regions do not have presence of said lacquer. The droplets form corresponding one or more lacquer layer regions on the one or more predefined active regions such that the one or more lacquer layer regions are of a predefined thickness to enable their functional texturing. Thereafter, the method includes texturing of the one or more lacquer layer regions of the predefined thickness to form a functional texture, which enables light trapping and/or light extraction. A first electrical contact can also be deposited on the lacquer layer regions. Thereafter, the method includes depositing one or more semiconductor layers. Then a second electrical contact can also be deposited on the one or more semiconductor layers. Thereafter, a cover substrate is provided which is joined to the transparent substrate at a portion of the one or more non-active regions while encapsulating the one or more lacquer layer regions and the one or more semiconductor layers between itself and the transparent substrate.

In some embodiments, the texturing includes curing the one or more lacquer layer regions to develop native functional textures in them.

In some other embodiments, the texturing includes imprinting the functional texture on the one or more lacquer layer regions by ultraviolet embossing, hot embossing, etching, stamping or scribing followed by curing.

In some embodiments that material of the lacquer has a viscosity between 5 Ns/m$^2$ to 100 Ns/m$^2$, and preferably between 10 Ns/m$^2$ to 20 Ns/m$^2$, to enable spraying of lacquer in the form of droplets.

DESCRIPTION OF THE EXEMPLARY EMBODIMENTS

Before describing the present invention in detail, it should be observed that the present invention utilizes a combination of method steps and apparatus components related to a method of manufacturing a semiconductor device. Accordingly the apparatus components and the method steps have been represented where appropriate by conventional symbols in the drawings, showing only specific details that are pertinent for an understanding of the present invention so as not to obscure the disclosure with details that will be readily apparent to those with ordinary skill in the art having the benefit of the description herein.

While the specification concludes with the claims defining the features of the invention that are regarded as novel, it is believed that the invention will be better understood from a consideration of the following description in conjunction with the drawings, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms "a" or "an", as used herein, are defined as one or more than one. The term "another", as used herein, is defined as at least a second or more. The terms "including" and/or "having" as used herein, are defined as comprising (i.e. open transition). The term "coupled" or "operatively coupled" as used herein, is defined as connected, although not necessarily directly, and not necessarily mechanically.

Referring now to the drawings, there is shown in FIG. 1a, a stack of layers in an exemplary OLED 100a. The OLED 100a is shown to include an external light extraction layer 102, a transparent substrate 104, an internal light extraction layer 106, a first electrical contact 108, one or more organic layers 110 and 112, a second electrical contact 114 and a cover substrate 116, which encapsulates the internal light extraction layer 106, the first electrode 108, the one or more semiconductor layers 110 and 112 and the second electrode 114 between itself and the transparent substrate 104. Each layer of the OLED 100a, apart from the external light extraction layer 102 and the internal light extraction layer 106, can be coated or otherwise applied on the adjacent layer to implement the present invention.

Some real life examples of the OLED 100a can include, but are not limited to, Organic Light Emitting Diode (OLED), White Organic Light Emitting Diode (W-OLED), Active-matrix Organic Light Emitting Diodes (AMOLED), Passive-matrix Organic Light Emitting Diodes (PMOLED), Flexible Organic Light Emitting Diodes (FOLED), Stacked Organic Light Emitting Diodes (SOLED), Tandem Organic Light Emitting Diode, Transparent Organic Light Emitting Diodes (TOLED), Top Emitting Organic Light Emitting Diode, Bottom Emitting Organic Light Emitting Diode, Fluorescence doped Organic Light Emitting Diode (F-OLED) and Phosphorescent Organic Light Emitting Diode (PHOLED).

The transparent substrate 104 provides strength to the OLED 100a, and also acts as the emissive surface of the OLED 100a when in use. The examples of the transparent substrate 104 include, but are not limited to, glass, flexible glass, polyethylene terephthalate (PET), polyethylene naphthalate (PEN), and other transparent or translucent material.

The first electrical contact 108 and the second electrical contact 114 are used to apply a voltage across the one or more semiconductor layers 110 and 112. The first electrical contact 108 and the second electrical contact 114, can be implemented with, for example, transparent conductive oxide (TCO), such as indium tin oxide (ITO) or other metals with appropriate work function to make injection of charge carriers such as calcium, aluminum, gold, or silver.

The one or more semiconductor layers 110 and 112 can be implemented with any organic electroluminescent material such as a light-emitting polymer, evaporated small molecule materials, light-emitting dendrimers or molecularly doped polymers.

Light incident from a high refractive index material onto an interface with a lower refractive index material or medium undergoes total internal reflection (TIR) for all incidence angles greater than the critical angle $\theta_c$, defined by $\theta_c = \sin^{-1}(n_2/n_1)$, where $n_1$ and $n_2$ are the refractive indices of the high refractive index material and low refractive index material, respectively. Due to the same reason, when the light emitted by the semiconductor layer 110 or 112 reaches their interface with the transparent substrate 104, a substantial amount of light is reflected back into the semiconductor layers 110 and 112.

Presence of an internal light extraction layer 106 having a texture that is capable of changing the propagation direction of the light emitted by the semiconductor layer 110 or 112 at their interface with the transparent substrate 104, helps to reduce the reflection (or TIR) of the light back into the OLED 100a. The texture on the internal light extraction layer 106 may include geometries having dimensions in the order of the wavelength of the light to facilitate the change in propagation direction of the emitted light by diffraction. The texture on the internal light extraction layer 106 may also include geometries having larger dimensions than the wavelength of the light to facilitate the change in propagation direction of the emitted light by refraction. Therefore, presence of an internal light extraction layer 106 having textures eliminates or reduces the TIR, which further increases the efficiency of the OLED. In a similar manner, the external light extraction layer 102 reduces or eliminates the TIR at an interface between the transparent substrate 104 and an ambient medium.

Referring now to FIG. 1b, there is shown a stack of layers in an exemplary OPV 100b. The OPV 100b is shown to include a transparent substrate 118, a light trapping layer 120, a first electrical contact 122, one or more semiconductor layers 124 and 126, a second electrical contact 128 and a cover substrate 130.

In the OPV 100b, the light falling on the semiconductor layers 124 and 126 enable generation of electricity through the semiconductor layers 124 and 126, which is extracted into external circuits by the first and second electrical contacts 122 and 128. In the OPV 100b, the light trapping layer 120 is provided to increase an optical path of the light transmitted in to the OPV 100b.

For the purpose of description, different embodiments of the present invention have been explained in reference to an OLED and light extraction, however, it will be readily apparent to those with ordinary skill in the art that the present invention can be implemented in the OPVs as well for light management purposes, like, light trapping.

Figure 2:
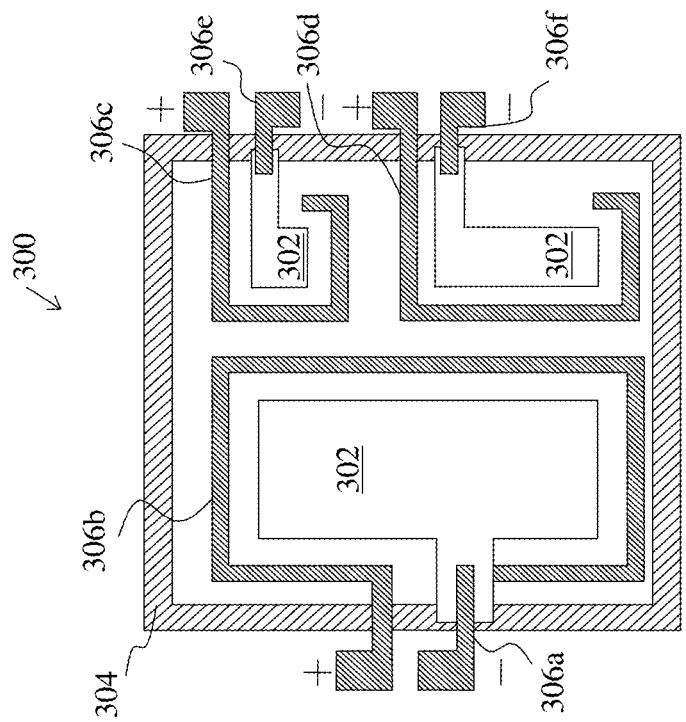
FIG. 2 shows the top view of an exemplary substrate with active and non-active regions, in accordance with some embodiments of the present invention.

FIG. 2 shows the top view of an exemplary transparent substrate 200 with active and non-active regions, in accordance with some embodiments of the present invention. Those skilled in the art will appreciate that the transparent substrate 200 may include all or a few components or regions shown in FIG. 2. The transparent substrate 200 may include components or regions that are not shown here and are not germane to various embodiments of the present invention.

For the purpose of this description the exemplary transparent substrate 200, hereinafter, referred to as transparent substrate 200, is shown to include one or more predefined active regions 202 and one or more non-active regions 204.

The one or more predefined active regions 202 include those regions of the transparent substrate 200 on which active layers of the semiconductor device, i.e., the semiconductor layers of the OLED or OPV are deposited. Although for the purpose of this description, the one or more predefined active regions 202 on which one or more lacquer layer regions are formed (as described in conjunction with FIGS. 4, 5 and 6), are shown to be those regions of the transparent substrate 200 on which active layers of the semiconductor device are deposited, it will be readily apparent to those with ordinary skill in the art that the one or more predefined active regions 202 may be smaller or larger than those regions of the transparent substrate 200 on which active layers of the semiconductor device are deposited. For example, the one or more predefined active regions 202 may be kept larger than those regions of the transparent substrate 200 on which active layers of the semiconductor device are deposited to have an optimal out-coupling effect.

Remaining area of the transparent substrate 200, i.e., an area other than the one or more predefined active regions 202, substantially forms the one or more non-active regions 204. The examples of materials used for the transparent substrate 200 include, but are not limited to, glass, flexible glass, polyethylene terephthalate (PET), polyethylene naphthalate (PEN), and other transparent or translucent material.

FIG. 3 shows the top view of an exemplary OLED 300 without a cover substrate, in accordance with some embodiments of the present invention. Those skilled in the art will appreciate that the exemplary OLED 300 may include all or a few components or regions shown in FIG. 3. The exemplary OLED 300 may include components or regions that are not shown here and are not germane to various embodiments of the present invention.

The exemplary OLED 300, hereinafter referred to as OLED 300, uses the transparent substrate 200 as its substrate. The exemplary OLED 300 is shown to include a stack of active layers 302, or the one or more semiconductor layers 302, visible only as a single layer in the top view, sandwiched between first electrical contacts 306b, 306c and 306d and second electrical contacts 306a, 306e and 306f. The OLED 300 also shows a portion 304 of the transparent substrate 200, which is devoid of the one or more semiconductor layers 302. A cover substrate for encapsulating the one or more semiconductor layers 302 can be joined to the transparent substrate 200 at the portion 304. Further, not visible in the FIG. 3 is a textured lacquer layer deposited on the transparent substrate 200 before depositing the first electrical contacts 306b, 306c and 306d. The textured lacquer layer, an exemplary process of its deposition in accordance with the present invention is explained in conjunction with the subsequent Figures, specifically, the FIGS. 4, 6, 7, 9 and 10.

When a voltage is applied across the first electrical contacts 306b, 306c and 306d and the second electrical contacts 306a, 306e and 306f, the one or more semiconductor materials 302 emit light due to their characteristics of electroluminescence. This light emitted by the one or more semiconductor layers 302 can be extracted through the transparent substrate 200.

Although to explain the invention, the OLED 300 is shown to include components that may be lesser or greater in number than the number of components available in different types and versions of OLEDs, it will be readily apparent to those with ordinary skill in the art that the OLED 300, in accordance with the present invention, can be any type of OLED, for example, but not limited to, White Organic Light Emitting Diode (W-OLED), Active-matrix Organic Light Emitting Diodes (AMOLED), Passive-matrix Organic Light Emitting Diodes (PMOLED), Flexible Organic Light Emitting Diodes (FOLED), Stacked Organic Light Emitting Diodes (SOLED), Tandem Organic Light Emitting Diode, Transparent Organic Light Emitting Diodes (TOLED), Top Emitting Organic Light Emitting Diode, Bottom Emitting Organic Light Emitting Diode, Fluorescence doped Organic Light Emitting Diode (F-OLED) and Phosphorescent Organic Light Emitting Diode (PHOLED).

Figure 4:
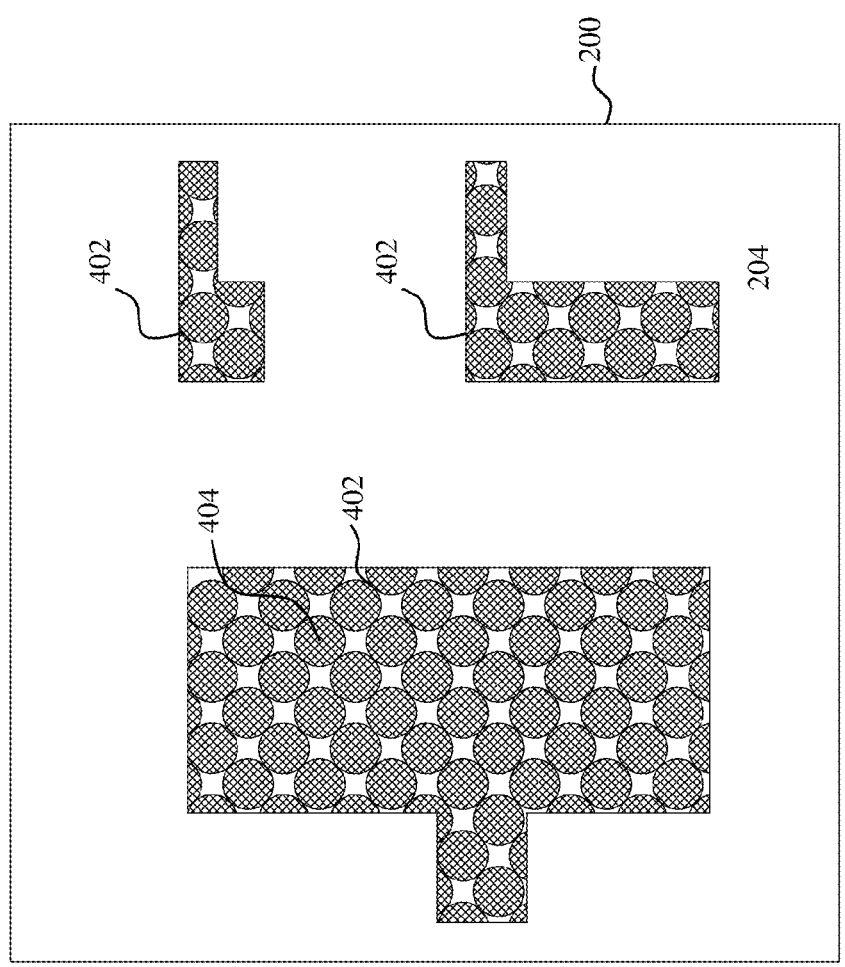
FIG. 4 shows the top view of an exemplary substrate with a layer of a textured lacquer, in accordance with some embodiments of the present invention.

FIG. 4 shows the top view of an exemplary substrate 200 with one or more lacquer layer regions having a functional texture 402, hereinafter referred to as a textured lacquer layer 402, in accordance with some embodiments of the present invention. In accordance with the present invention the textured lacquer layer 402 is shown to be deposited on the one or more active regions 202 of the transparent substrate 200. A functional texture of the textured lacquer layer 402 is provided to facilitate light extraction in the OLED that includes the textured lacquer layer 402, for example, the OLED 300. The functional texture creates depressions and/or protrusions that facilitate the formation of the textured lacquer layer 402. In some embodiments, the height and/or depth of the protrusions and/or depressions respectively may range between 200 to 800 nanometers. To enable the formation of functional texture, the thickness of the textured lacquer layer 402 is kept at a predefined thickness. In an embodiment, the predefined thickness ranges between 2 to 8 microns. For the purpose of this description, the functional texture on the textured lacquer layer 402 is shown to be a continuously repetitive pattern of a shape 404, however, it will be readily apparent to those with ordinary skill in the art that any other functional texture that facilitates the light extraction can be used without deviating from the scope of the invention.

Figure 5:
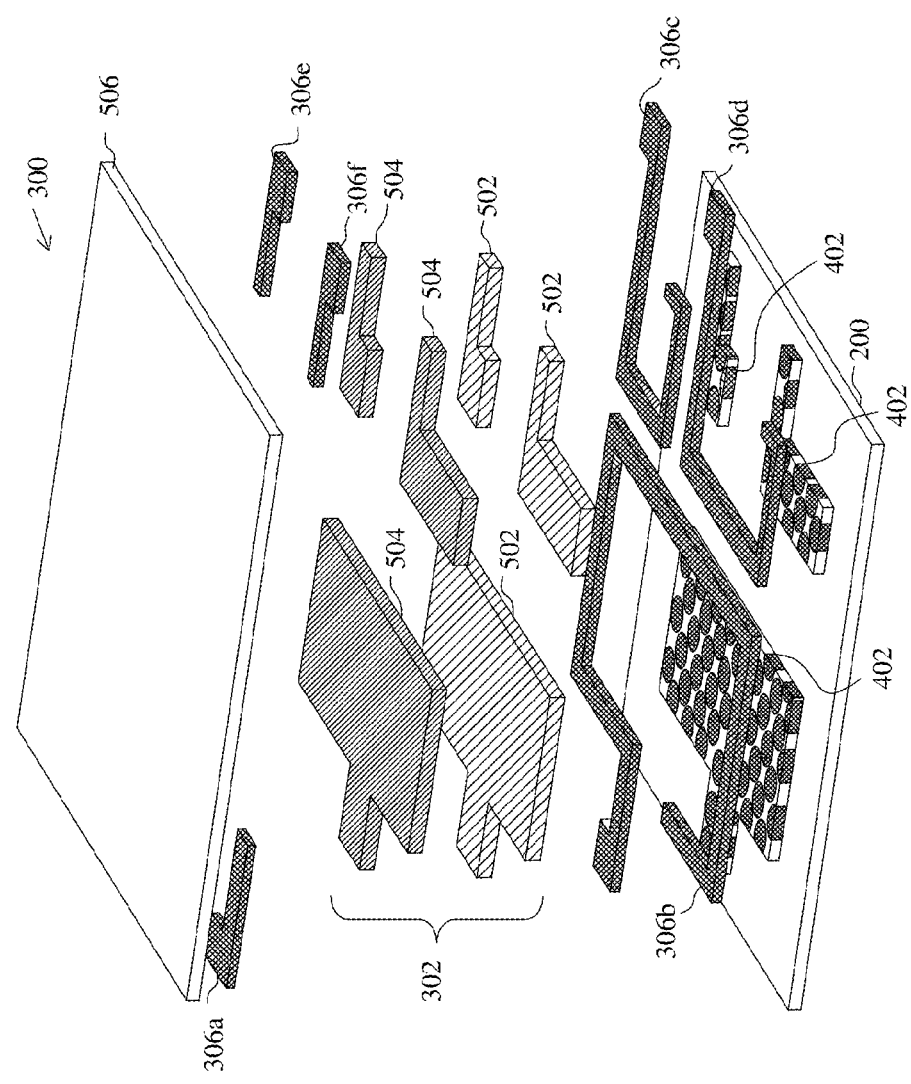
FIG. 5 shows the exploded view of an exemplary OLED, in accordance with some embodiments of the present invention.

FIG. 5 shows the exploded view of the exemplary OLED 300, in accordance with some embodiments of the present invention. The exemplary OLED 300 is shown to include the transparent substrate 200, the textured lacquer layer 402, the first electrical contacts, the one or more semiconductor layers 302, the second electrical contacts and a cover substrate 506. Further, the one or more semiconductor layers 302 further includes a first semiconductor layer 502 and a second semiconductor layer 504.

Those skilled in the art will appreciate that the exemplary OLED 300 may include all or a few components or regions shown in FIG. 5. The exemplary OLED 300 may include components or regions that are not shown here and are not germane to various embodiments of the present invention. For example, without deviating from the scope of the invention, the OLED 300 may also include additional semiconductor layers for emitting different colours of lights. In another example, the OLED 300 may also include additional layers for functional improvement of the OLED, like, the hole transport layer and the electron transport layer.

In an embodiment, the first semiconductor layer 502 is a conductive type semiconductor layer, such that, it is capable of facilitating transport of holes from the first electrical contacts 306b, 306c and 306d, i.e., the anode. Examples of a material used for the first semiconductor layer 502 include, but are not limited to, polyaniline. The first semiconductor layer 502 can be deposited by using various methods, such as dip coating, spin coating, doctored blade, spray coating, screen printing, sputtering, glass mastering, photoresist mastering, electroforming, and evaporation.

In an embodiment, the second semiconductor layer 504 is an emissive type semiconductor layer, such that, it is capable of facilitating transport of electrons from the second electrical contacts 306a, 306e and 306f, i.e., the cathode. Examples of a material used for the second semiconductor layer include, but are not limited to, polyfluorene. The second semiconductor layer 504 can be deposited by using various methods, such as dip coating, spin coating, doctored blade, spray coating, screen printing, sputtering, glass mastering, photoresist mastering, electroforming, and evaporation.

The cover substrate encapsulates the one or more lacquer layer regions 402, or the textured lacquer layer 402, the first electrical contacts 306b, 306c and 306d, the first semiconductor layer 502, the second semiconductor layer 504, and the second electrical contacts 306a, 306e and 306f between itself and the transparent substrate.

Figure 6:
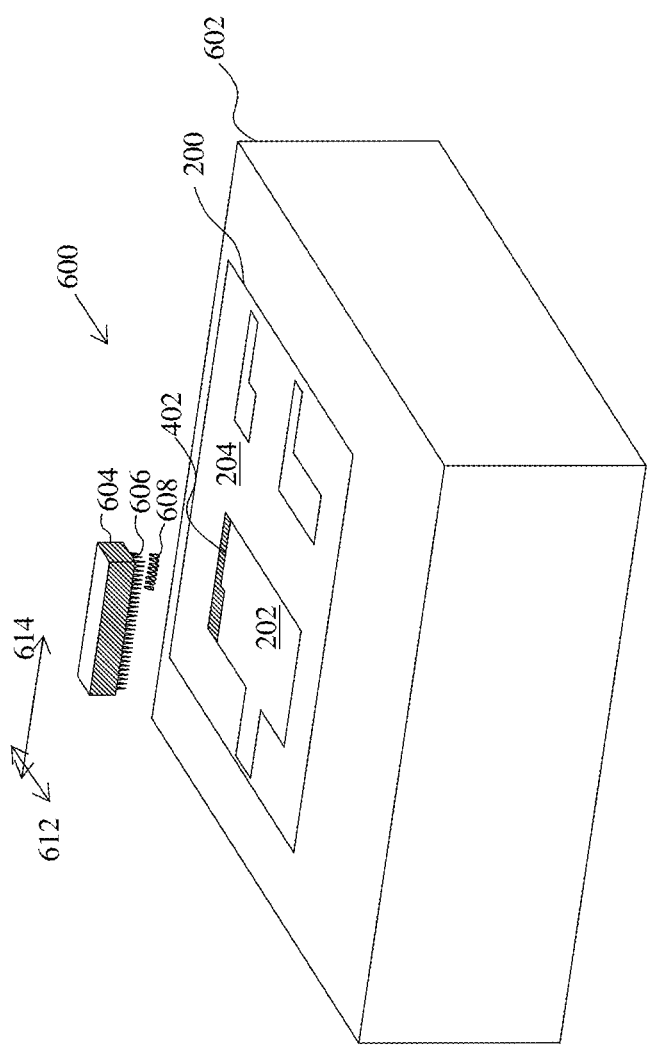
FIG. 6 illustrates an exemplary implementation of the process of spraying droplets of lacquer on the substrate, in accordance with some embodiments of the present invention.

FIG. 6 illustrates an exemplary device 600 used to implement the process of spraying droplets of lacquer on the transparent substrate, in accordance with some embodiments of the present invention. A real life example of the exemplary device 600 is an ink-jet printing machine, therefore, the exemplary device 600 is hereinafter referred to as the ink-jet printing machine 600.

Those skilled in the art will appreciate that the ink-jet printing machine 600 may include all or a few components or regions shown in FIG. 6. The ink-jet printing machine 600 may include components or regions that are not shown here and are not germane to various embodiments of the present invention.

The ink-jet printing machine 600 is shown to include a platform 602 on which the transparent substrate 200 is positioned to facilitate spraying of the droplets on the transparent substrate 200. Further, the ink-jet printing machine 600 is shown to include a print head 604 that has one or more nozzles 606. The print head 604 and the platform 602 can have a relative motion in mutually perpendicular directions 612 and 614. A motion of the print head 604 and the platform 602 and a triggering of the nozzles 606 can be synchronized such that the droplets 608 of the lacquer are sprayed only at the one or more predefined active regions 202, while keeping the one or more non-active regions 204 devoid of any lacquer droplets.

Spraying of droplets 608 of lacquer on the one or more predefined active regions 202 forms one or more lacquer layer regions 402 on the one or more predefined active regions 202.

Although for the purpose of this description, the one or more predefined active regions 202 on which the one or more lacquer layer regions 402 are formed, are shown to be those regions of the transparent substrate 200 on which active layers of the semiconductor device are deposited, it will be readily apparent to those with ordinary skill in the art that the one or more predefined active regions 202 may be smaller or larger than those regions of the transparent substrate 200 on which active layers of the semiconductor device are deposited. For example, the one or more predefined active regions 202 may be kept larger than those regions of the transparent substrate 200 on which active layers of the semiconductor device are deposited to have an optimal out-coupling effect.

To enable the lacquer to be used as an ink and be sprayed on the transparent substrate 200, a material of the lacquer is so selected that the viscosity of this material is between 5 $Ns/m^2$ to 100 $Ns/m^2$. Preferably, the material of the lacquer is so selected that the viscosity of this material is between 10 $Ns/m^2$ to 20 $Ns/m^2$. Some examples of the material of the lacquer may include, but are not limited to, a plastic, a photopolymer lacquer, an acrylate, and silica or silica-titania based sol-gel material, such that a viscosity can be brought in the abovementioned ranges by heating and/or melting.

Further, a functional texture needs to be provided on the one or more lacquer layer regions 402 to facilitate light extraction in the OLED, for example, the OLED 300. To enable this, the thickness of one or more lacquer layer regions 402 is kept at a predefined thickness. In an embodiment, the predefined thickness ranges between 2 to 8 microns. The required thickness determines the amount of lacquer that needs to be sprayed on the transparent substrate 200, which in turn determines the size and the number of droplets 608 to be sprayed. By controlling the size and the number of droplets 608 by the ink-jet printing machine 600, the thickness of the one or more lacquer regions can be controlled.

Figure 7:
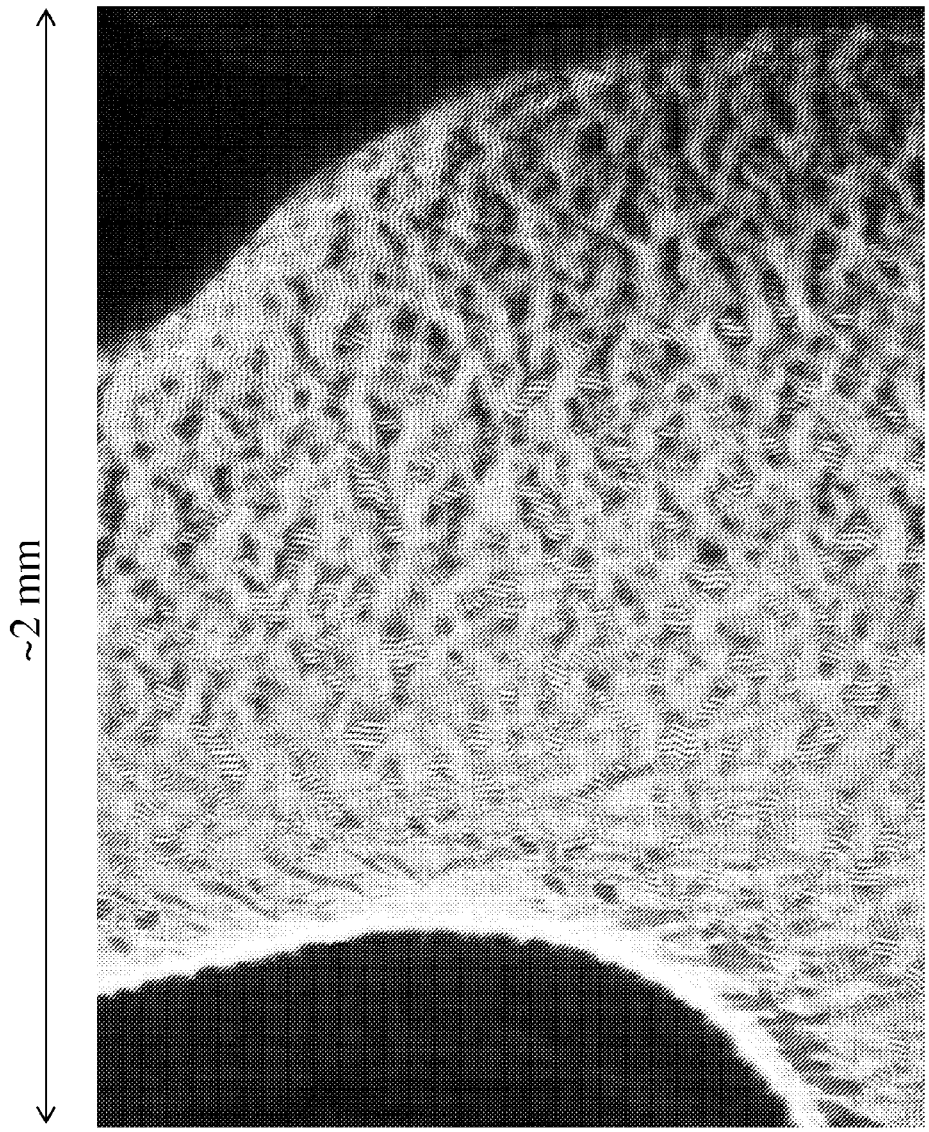
FIG. 7 shows an exemplary inherent texture formed in a lacquer layer, in accordance with some embodiments of the present invention.

FIG. 7 shows an exemplary inherent texture formed in the one or more lacquer layer regions 402, in accordance with some embodiments of the present invention. The inherent texture may be formed in the one or more lacquer layer regions 402 by using heat, light or Ultraviolet light under predefined conditions. Formation of such inherent textures is a characteristic response of the material used for the one or more lacquer layer regions 402 to conditions like heat, light or Ultraviolet light. By controlling the parameters of the conditions like heat, light and the Ultraviolet light, the texture can be controlled. An optimal set of predefined parameters corresponding to the conditions like heat, light and the Ultraviolet light may be defined to obtain a desired inherent texture capable of facilitating light extraction in the OLED, for example, the OLED 300. In some embodiments, an additional layer (not shown in the Figures) may also be required to be deposited on the one or more lacquer layer regions 402 to develop necessary stress in the one or more lacquer layer regions 402 and enable formation of the desired inherent texture. For example, a thin additional layer of sputtered metal, Indium Tin Oxide (ITO), an inorganic material or the like having a thickness of nearly 5 nanometers may be deposited on the one or more lacquer layer regions 402 for inducing stress and enabling formation of the inherent texture.

Figure 8B:
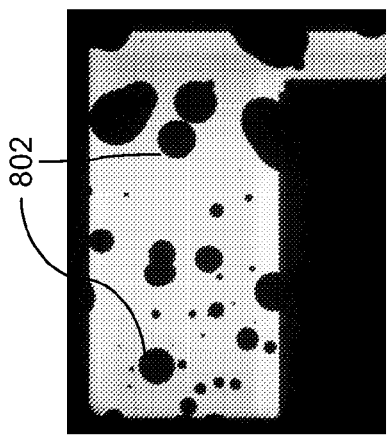
FIGS. 8$a$, 8$b$ and 8$c$ show exemplary defects the present invention aims to eliminate.
Figure 8C:
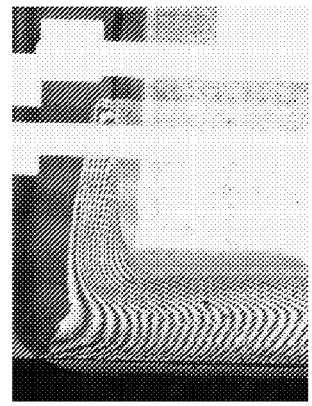
Figure 8A:
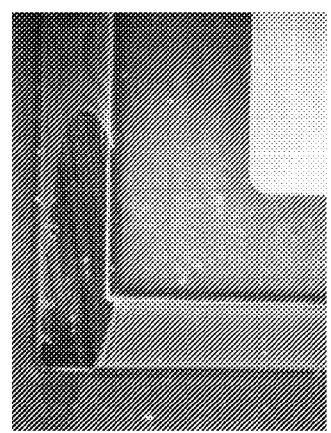

FIGS. 8a, 8b and 8c show exemplary defects the present invention aims to eliminate. The exemplary defects shown are caused due to the presence of the lacquer in portions of the one or more non-active regions of the OLED, where the lacquer FIG. 8a illustrates delamination of electrical contacts of an OLED due to contact with the lacquer. FIG. 8c illustrates delamination of an encapsulation of the OLED due to the presence of the lacquer at a portion of contact of the transparent substrate and the cover substrate. Similarly, dark spots 802 in FIG. 8b depict areas in the OLED where the one or more semiconductor layers have been contaminated by moisture, and thereby, unable to emit light.

Figure 9:
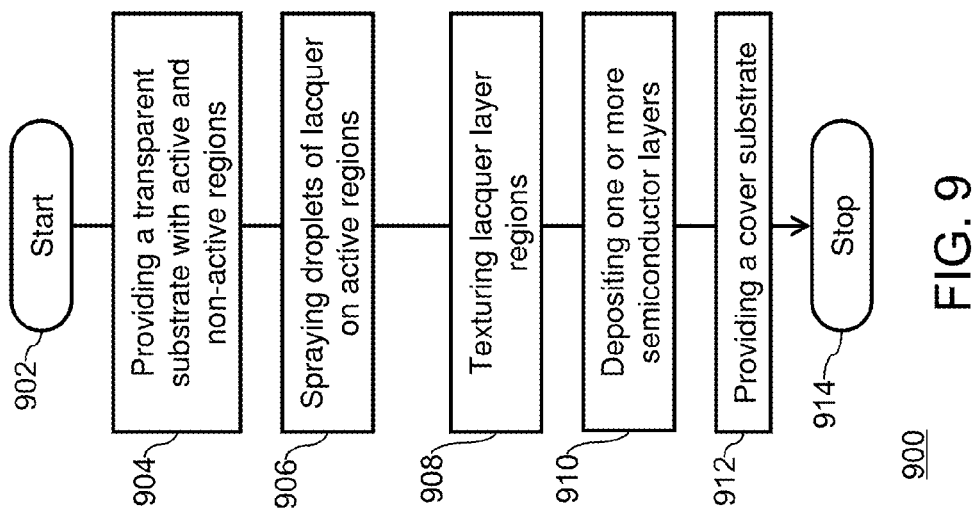
FIG. 9 is a flow chart describing an exemplary method of manufacturing an OLED, in accordance with some embodiments of the present invention.

FIG. 9 is a flow chart describing an exemplary method 900 of manufacturing an OLED, for example, the OLED 300, in accordance with an embodiment of the present invention. To describe the method 900, reference will be made to FIGS. 1, 2, 3, 4, 5, 6, 7 and 8 although it is understood that the method 900 can be implemented in any other suitable environment. Moreover, the invention is not limited to the order in which the steps are listed in the method 900. Further, it will also be apparent to those skilled in the art that the method 900 may include one or more additional steps for further enhancement of the effectiveness of the method 900, however, are not essential to the method 900, in accordance with the present invention.

The method 900 is initiated at step 902. At step 904, a transparent substrate with one or more predefined active regions and one or more non-active regions is provided. The examples of materials used for the transparent substrate include, but are not limited to, glass, flexible glass, polyethylene terephthalate (PET), poluethylene naphthalate (PEN), and other transparent or translucent material.

For the purpose of this description, a transparent substrate 200 is described in detail in conjunction with FIG. 2. The transparent substrate 200 has the one or more predefined active regions 202 and the one or more non-active regions 204. The one or more predefined active regions 202 are the regions on which one or more semiconductor layers, for example, the one or more semiconductor layers 502 and 504, having electroluminescent capabilities are deposited. Accordingly, the one or more predefined regions 202 are the regions that will receive the light emitted by the one or more semiconductor layers 502 and 504, and hence, the one or more predefined regions 202 require the light extraction functionality.

The one or more non-active regions 204 substantially include the remaining regions of the transparent substrate 200 apart from the one or more predefined regions 202.

Thereafter, at step 906 droplets of a lacquer are sprayed on the one or more predefined active regions of the substrate, such that the one or more non-active regions do not have presence of the lacquer. The droplets form corresponding one or more lacquer layer regions on the one or more predefined active regions.

Referring to FIG. 6, the droplets of lacquer are shown to be deposited on one or more predefined active regions 202 of the transparent substrate 200 by using the ink-jet printing machine 600. The ink-jet printing machine 600 has been described in detail in conjunction with FIG. 6.

The motion of the print head 604 and the platform 602 and triggering the nozzles 606 can be synchronized such that the droplets 608 of the lacquer are sprayed only at the one or more predefined active regions 202, while keeping the one or more non-active regions 204 devoid of any lacquer droplets.

Spraying of droplets 608 of lacquer on the one or more predefined active regions 202 form one or more lacquer layer regions 402 on the one or more predefined active regions 202.

To enable the lacquer to be used as an ink and be sprayed on the transparent substrate 400, a material of the lacquer is so selected that the viscosity of this material is between 5 $Ns/m^2$ to 100 $Ns/m^2$. Preferably, the material of the lacquer is so selected that the viscosity of this material is between 10 $Ns/m^2$ to 20 $Ns/m^2$. Some examples of the material of the lacquer may include, but are not limited to, a plastic, a photopolymer lacquer, an acrylate, and silica or silica-titania based sol-gel material, such that a viscosity can be brought in the abovementioned ranges by heating and/or melting.

Further, a functional texture needs to be provided on the one or more lacquer layer regions 402 to facilitate light extraction in the OLED, for example, the OLED 300. To enable this, the thickness of one or more lacquer layer regions 402 is kept at a predefined thickness. In an embodiment, the predefined thickness ranges between 2 to 8 microns. The required thickness determines the amount of lacquer that needs to be sprayed on the transparent substrate 200, which in turn determines the size and the number of droplets 608 to be sprayed. By controlling the size and the number of droplets 608 by the ink-jet printing machine 600, the thickness of the one or more lacquer regions can be controlled.

Thereafter, at step 908, the one or more lacquer layer regions are textured. For example, the one or more lacquer layer regions 402 are textured. The texturing enables light extraction in the OLED 300, by changing the propagation direction of the light emitted by the one or more semiconductor layers to eliminate or reduce the Total Internal Reflection (TIR) of the light back into the one or more semiconductor layers. After texturing, the one or more lacquer layer regions include one or more types of geometries to change the direction of the propagation of the light and help reduce TIR. For example, the geometries having dimensions in the order of the wavelength of the light may facilitate the change in propagation direction of the emitted light by diffraction. Similarly, the geometries having larger dimensions than the wavelength of the light may facilitate the change in propagation direction of the emitted light by refraction.

For the purpose of this description, the deposition and texturing of the one or more lacquer layer regions is explained for the purpose of internal light extraction in an OLED. However, it will be readily apparent to those skilled in the art that the present invention can be implemented for external light extraction in an OLED, light trapping in an OPV and any other similar application.

In an embodiment, the texturing step 908 involves curing the one or more lacquer layer regions 402 using heat, light or Ultraviolet light under predefine conditions such that inherent functional textures are developed in the one or more lacquer layer regions 402. A non-limiting example of the inherent functional texture is provided in the FIG. 7.

Figure 10:
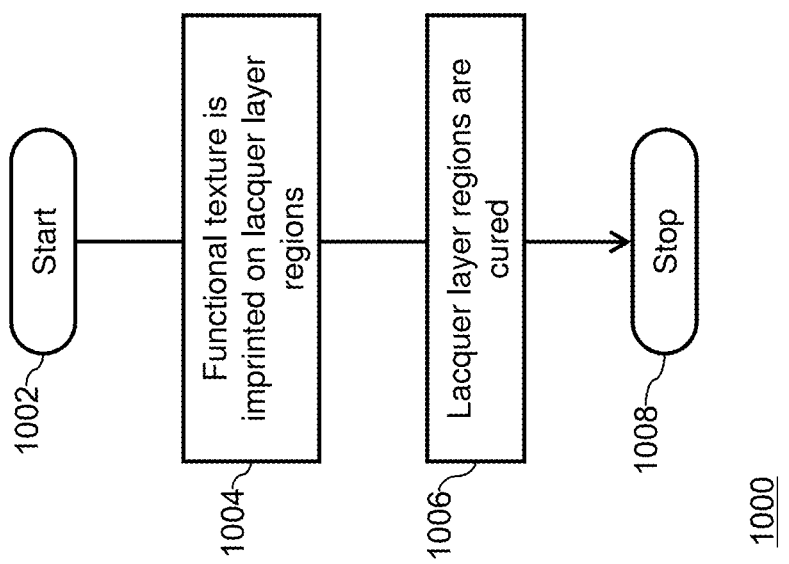
FIG. 10 is a flow chart describing an exemplary texturing process, in accordance with some embodiments of the present invention.

In another embodiment, the texturing step 908 is a multi-step process as illustrated by the flowchart in the FIG. 10. At step 1002, the texturing step 908 begins. At step 1004, the functional texture is imprinted on the one or more lacquer layer regions by ultraviolet embossing, hot embossing, etching, stamping or scribing. Thereafter, at step 1006, the one or more lacquer layer regions are cured. The texturing step 908, thereafter, ends at step 1008.

Thereafter at the step 910 of the method 900, one or more semiconductor layers are deposited on the one or more lacquer layer regions. Referring to FIG. 5, the one or more semiconductor layers 502 and 504 are deposited on the one or more lacquer layer regions 402. The one or more semiconductor layers 502 and 504 can be deposited by using various methods, such as dip coating, spin coating, doctored blade, spray coating, screen printing, sputtering, glass mastering, photoresist mastering, electroforming, and evaporation. Some examples of the materials used to deposit the one or more semiconductor layers 502 and 504 include, but are not limited to, light-emitting polymer, evaporated small molecule materials, light-emitting dendrimers or molecularly doped polymers.

Figure 12:
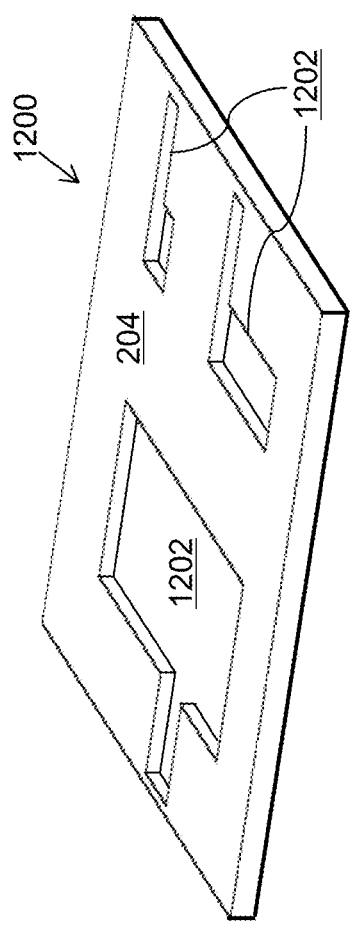
FIG. 12 illustrates an exemplary transparent substrate with pockets for one or more predefined active regions, in accordance with some embodiments of the present invention.

In some embodiments, a macroscopically plain surface may be required to deposit the one or more semiconductor layers 502 and 504. For example, in those applications where the one or more semiconductor layers 502 and 504 need to be removed from some predefined portions by using contact masks, the placement of contact masks may get flawed due to unevenness of surface beneath the one or more semiconductor layers 502 and 504. However, presence of the functional texture on the one or more lacquer layer regions 402 beneath the semiconductor layers 502 and 504 may hinder the provision of a flat surface in such applications. Therefore, in such embodiments the transparent substrate is so selected of made that it has pockets or slots corresponding to the one or more predefined active regions. An example of such a transparent substrate 1200 is illustrated in the FIG. 12. The transparent substrate 1200 is shown to include the one or more non-active regions 204 and pockets 1202 corresponding to the one or more predefined active regions.

Another alternative to provide a macroscopically plane surface for deposition of the one or more semiconductor layers 502 and 504, is to planarize the one or more lacquer layer regions by depositing a planarization layer of a material having a refractive index comparable to that of the refractive index of the one or more semiconductor layers 502 and 504. Since, the refractive index of the planarization layer is comparable to the refractive index of the one or more semiconductor layers 502 and 504 there is no or very less TIR at an interface of the planarization layer and the one or more semiconductor layers 502 and 504. To illustrate this embodiment FIG. 13 shows an exemplary planarization layer 1302 deposited after the one or more lacquer layer regions 402. Similarly FIG. 14 shows an exemplary planarization layer 1302 deposited after the one or more lacquer layer regions 402 when the transparent substrate 1200 having pockets 1202 is used.

In a preferred embodiment, the planarization layer 1302 is deposited using the ink-jet printing process, similar to the one explained in conjunction with FIG. 6.

Further, it will be apparent to those skilled in the art that before depositing the one or more semiconductor layers 502 and 504, first electrical contacts 306b, 306c and 306d are deposited on the one or more lacquer layer regions 402. Similarly, the second electrical contacts 306a, 306e and 306f are deposited after depositing the one or more semiconductor layers 502 and 504. When a voltage is applied across the first electrical contacts 306b, 306c and 306d and the second electrical contacts 306a, 306e and 306f, the one or more semiconductor materials 502 and 504 emit light due to their characteristics of electroluminescence. This light emitted by the one or more semiconductor layers 902 and 904 can be obtained through the transparent substrate 200. The one or more lacquer layer regions 402 will prevent the reflection of the emitted light back into the semiconductor layers due to the functional texture, which tends to increase an area where an angle of incidence of the light on one or more lacquer layer regions 402 is less than the critical angle. To enable this, the functional texture includes geometries that change the propagation direction of the light. Accordingly, an efficiency of the OLED 300 increases. An exemplary functional texture that enables such light extraction and increase in efficiency is illustrated in FIG. 4. The exemplary functional texture is shown to include a two-dimensional matrix of crests 404, however, it will be readily apparent to those with ordinary skill in the art that any other functional texture can also be used without deviating from the scope of the invention.

For the purpose of this description, the functional texture is shown to be imprinted on the one or more lacquer layer regions for the purpose of internal light extraction in an OLED. However, it will be readily apparent to those skilled in the art that the functional texture can be imprinted on a layer similar to one or more lacquer layer regions deposited on an outer surface of the transparent substrate for external light extraction. Similarly, those with the ordinary skill in the art will also appreciate that the functional texture can also be imprinted on a light trapping layer in an OPV.

Thereafter at the step 912 of the method 900, a cover substrate is provided on the one or more semiconductor layers, such that the cover substrate is joined to said transparent substrate at a portion of the one or more non-active regions and encapsulates the one or more lacquer layer regions and the one or more semiconductor layers between itself and the transparent substrate.

Referring to FIG. 5, the cover substrate 506 is shown to be provided such that the one or more lacquer layer regions 402, the first electrical contacts 306b, 306c and 306d, the one or more semiconductor layers 502 and 504, and the second electrical contacts 306a, 306e and 306f lie between the transparent substrate 200 and the cover substrate 506. Referring to FIG. 3, which shows a top view of the OLED without the cover substrate, there is shown the portion 304 of the one or more non-active regions 204 of the transparent substrate 200 (Refer FIG. 2). The cover substrate 506 joins the transparent substrate 200 on the portion 304, thereby encapsulating the one or more lacquer layer regions 402, the first electrical contacts 306b, 306c and 306d, the one or more semiconductor layers 502 and 504, and the second electrical contacts 306a, 306e and 306f.

As described in conjunction with FIG. 6, the droplets 608 of lacquer were sprayed only on the one or more predefined active regions 402 of the transparent substrate 400, while the one or more non-active regions 404 were kept devoid of the lacquer droplets 608. Therefore, there is no lacquer layer between the cover substrate 506 and the transparent substrate 200 at the portion 304.

The presence of lacquer material between the cover substrate and the transparent substrate may lead to an inefficient encapsulation that may allow some moisture to enter in to the OLED 300 and contaminate the layers in between, i.e., one or more lacquer layer regions 402, the first electrical contacts 306b, 306c and 306d, the one or more semiconductor layers 502 and 504, and the second electrical contacts 306a, 306e and 306f. For example, FIG. 8c illustrates delamination of the encapsulation due to the presence of the lacquer at the portion of contact of the transparent substrate and the cover substrate. Similarly, dark spots 802 in FIG. 8b depict areas in the OLED where the one or more semiconductor layers have been contaminated by moisture, and thereby, unable to emit light.

Also, the lacquer material tends to generate fluids, during the process of manufacturing the OLED, which tend to corrode the electrical contacts. This may lead to improper or unpredictable light emission and/or increased electricity consumption by the OLED.

Therefore, eliminating the presence of the lacquer material at the portion 304, in accordance with the present invention, facilitates elimination of one or more of the defects highlighted in the foregoing paragraphs.

Figure 11:
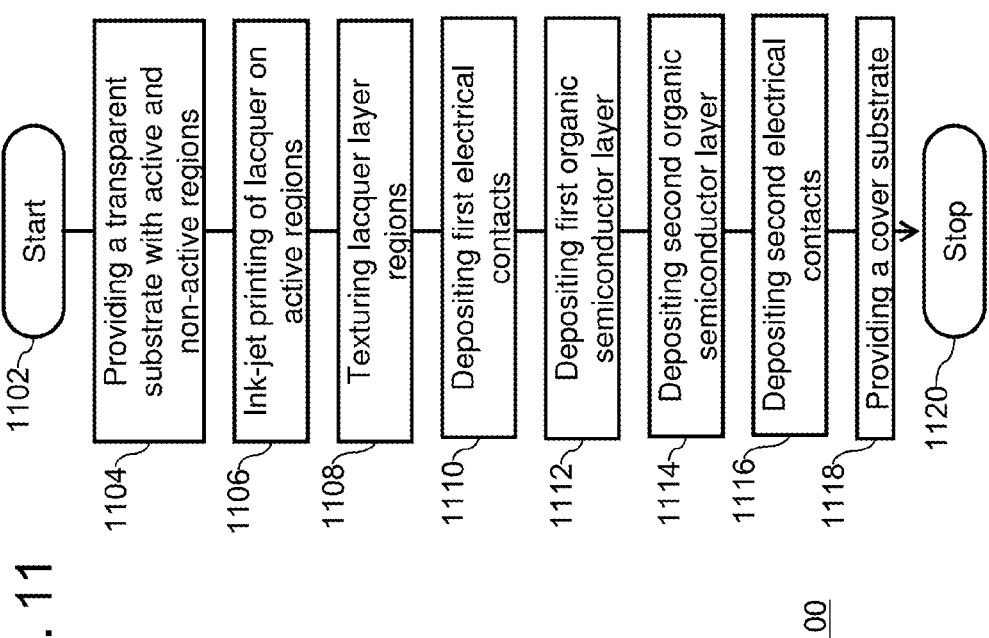
FIG. 11 is a flow chart describing an exemplary method of manufacturing an OLED, in accordance with some embodiments of the present invention.

Referring now to FIG. 11, an exemplary method 1100 for manufacturing the OLED, for example, the OLED 300, is provided. To describe the method 1100, reference will be made to FIGS. 2, 3, 4, 5, 6, 8, 9 and 10 although it is understood that the method 1100 can be implemented in any other suitable environment. Moreover, the invention is not limited to the order in which the steps are listed in the method 1100. Further, it will also be apparent to those skilled in the art that the method 1100 may include one or more additional steps for further enhancement of the effectiveness of the method 1100, however, are not essential to the method 1100, in accordance with the present invention.

The method is initiated at step 1102. At step 1104, a transparent substrate having one or more predefined active regions and one or more non-active regions is provided. For example, a transparent substrate 200, with one or more predefined active regions 202 and one or more non-active regions 204 is provided. The examples of materials used for the transparent substrate include, but are not limited to, glass, flexible glass, poluethylene terephthalate (PET), poluethylene naphthalate (PEN), and other transparent or translucent material.

Thereafter, at step 1106, one or more lacquer layer regions 402 are deposited on the one or more predefined active regions 204 by using ink-jet printing (Refer FIG. 6). In the ink-jet printing a material of the lacquer layer regions 402 is used as an ink and its droplets 608 are sprayed on the one or more predefined active regions 202. To enable its use as an ink in the ink-jet printing process, the lacquer material is so selected that the viscosity of this material is between 5 Ns/m$^2$ to 100 Ns/m$^2$. Preferably, the material of the lacquer is so selected that the viscosity of this material is between 10 Ns/m$^2$ to 20 Ns/m$^2$. Some examples of the material of the lacquer may include, but are not limited to, a plastic, a photopolymer lacquer, an acrylate, and silica or silica-titania based sol-gel material, such that a viscosity can be brought in the abovementioned ranges by heating and/or melting.

Thereafter, at step 1108, a functional texture is provided on the one or more lacquer layer regions 402. As explained in conjunction with FIGS. 7 and 9, in one embodiment the functional texture is provided as an inherent texture by curing the one or more lacquer layer regions 402. In another embodiment, the texture is imprinted by ultraviolet embossing, hot embossing, etching, stamping or scribing, followed by curing. The functional texture enables light extraction in the OLED 300.

Thereafter, at step 1110, first electrical contacts 306b, 306c and 306d are deposited on the one or more lacquer layer regions. A material for the first electrical contacts 306b, 306c and 306d can be any transparent conducting material, for example, a transparent conducting oxide (TCO) like Indium Tin Oxide (ITO) or Zinc Oxide. The first electrical contacts 306b, 306c and 306d can be deposited by using various methods, such as dip coating, spin coating, doctored blade, spray coating, screen printing, sputtering, glass mastering, photoresist mastering, electroforming, and evaporation.

In an embodiment, the first electrical contacts 306b, 306c and 306d act as anode.

Thereafter, at step 1112 the first semiconductor layer 502 is deposited. In an embodiment, the first semiconductor layer 502 is a conductive type semiconductor layer, such that, it is capable of facilitating transport of holes from the first electrical contacts 306b, 306c and 306d, i.e., the anode. Examples of a material used for the first semiconductor layer 502 include, but are not limited to, polyaniline. The first semiconductor layer 502 can be deposited by using various methods, such as dip coating, spin coating, doctored blade, spray coating, screen printing, sputtering, glass mastering, photoresist mastering, electroforming, and evaporation.

Thereafter, at step 1114 a second semiconductor layer 504 is deposited. In an embodiment, the second semiconductor layer 504 is an emissive type semiconductor layer, such that, it is capable of facilitating transport of electrons from the second electrical contacts 306a, 306e and 306f, i.e., the cathode. Examples of a material used for the second semiconductor layer include, but are not limited to, polyfluorene. The second semiconductor layer 504 can be deposited by using various methods, such as dip coating, spin coating, doctored blade, spray coating, screen printing, sputtering, glass mastering, photoresist mastering, electroforming, and evaporation.

Thereafter, at step 1116, second electrical contacts 306a, 306e and 306f are deposited on the second semiconductor layer 504. A material for the second electrical contacts 306a, 306e and 306f can be any conducting material, for example, a transparent conducting oxide (TCO) like Indium Tin Oxide (ITO), Zinc Oxide, or metals with appropriate work function to make injection of charge carriers such as calcium, aluminum, gold, or silver. The second electrical contacts 306a, 306e and 306f can be deposited by using various methods, such as dip coating, spin coating, doctored blade, spray coating, screen printing, sputtering, glass mastering, photoresist mastering, electroforming, and evaporation.

In an embodiment, the second electrical contacts 306a, 306e and 306f act as cathode.

In an exemplary embodiment, a hole transfer layer (not shown in the Figures) may also be deposited on the first electrical contacts 306b, 306c and 306d before depositing the first semiconductor layer 502. The hole transfer layer is capable of enhancing a flow of holes from the first electrical contacts 306b, 306c and 306d to the first semiconductor layer 302, and thereby increase an efficiency of the OLED 300.

Similarly, in yet another exemplary embodiment, an electron transfer layer (not shown in the Figures) may also be deposited on the semiconductor layer 504. The electron transfer layer is capable of enhancing a flow of electrons from the second electrical contacts 306a, 306e and 306f to the second semiconductor layer 504, and thereby increase an efficiency of the OLED 300.

Thereafter, at step 1118, a cover substrate 506 is provided on the second electrical contacts 306a, 306e and 306f, such that the cover substrate 506 is joined the transparent substrate 200 at a portion 304 of the one or more non-active regions 204 and encapsulates the one or more lacquer layer regions 402, the first electrical contacts 306b, 306c and 306d, the first semiconductor layer 502, the second semiconductor layer 504, and the second electrical contacts 306a, 306e and 306f between itself and the transparent substrate.

Thereafter, the method terminates at step 1120.

Various embodiments, as described above, provide a method for manufacturing a semiconductor device and a method to manufacture a lacquer layer that, which have several advantages. One of the several advantages is use of less material in the lacquer layer since only the lacquer is deposited only on the active regions instead of the whole transparent substrate. Another advantage is that the absence of lacquer in the portion of the non-active regions where the transparent substrate and the cover substrate join each prevents delamination of encapsulation. This further reduces or eliminates the entry of moisture or humidity into the semiconductor device, thereby preventing contamination of the semiconductor device.

Also, the lacquer material in contact with the electrical contacts may tend to corrode the electrical contacts. Therefore, another advantage of the present invention is that it prevents the corrosion of the electrical contacts as well.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A method of manufacturing a semiconductor device, said method comprising:
    providing a transparent substrate, said transparent substrate having one or more predefined active regions and one or more non-active regions;
    spraying droplets of a lacquer on said one or more predefined active regions such that said non-active regions do not have presence of said lacquer, wherein said droplets form one or more lacquer layer regions on said one or more predefined active regions, and wherein said one or more lacquer layer regions are of a predefined thickness to enable functional texturing of said one or more lacquer layer regions;
    texturing said one or more lacquer layer regions of said predefined thickness to form a functional texture, wherein said functional texture enables one of light trapping and light extraction;
    depositing one or more semiconductor layers on said one or more lacquer layer regions; and
    providing a cover substrate on said one or more semiconductor layers, wherein said cover substrate is joined to said transparent substrate at a portion of said one or more non-active regions whereby encapsulating said one or more lacquer layer regions and said one or more semiconductor layers between said cover substrate and said transparent substrate.

2. The method according to claim 1 further comprising depositing one or more electrical contacts on said one or more non-active regions of said transparent substrate.

3. The method according to claim 1, wherein said texturing comprises curing said one or more lacquer layer regions to develop native functional textures in said one or more lacquer layer regions.

4. The method according to claim 1, wherein said texturing comprises:
    imprinting said functional texture on said one or more lacquer layer regions by at least one of ultraviolet embossing, hot embossing, etching, stamping and scribing; and
    curing said one or more lacquer layer regions.

5. The method according to claim 1, wherein a viscosity of a material of said lacquer is between 5 Ns/m$^2$ to 100 Ns/m$^2$ to enable formation of said functional texture.

6. The method according to claim 1, wherein a viscosity of a material of said lacquer is between 10 Ns/m$^2$ to 20 Ns/m$^2$ to enable spraying of lacquer in the form of droplets.

7. The method according to claim 1, wherein said functional texture enables at least one of an internal light extraction and an external light extraction in said semiconductor device.

8. A method of manufacturing a semiconductor device, said method comprising:
    providing a transparent substrate, said transparent substrate having one or more predefined active regions and one or more non-active regions;
    ink jet printing a lacquer on said one or more predefined active regions such that said non-active regions do not have presence of said lacquer, wherein said droplets form one or more lacquer layer regions on said one or more predefined active regions, and wherein said one or more lacquer layer regions are of a predefined thickness to enable functional texturing of said one or more lacquer layer regions;
    texturing said one or more lacquer layer regions of said predefined thickness to form a functional texture, wherein said functional texture enables one of light trapping and light extraction;
    depositing one or more semiconductor layers on said one or more lacquer layer regions; and
    providing a cover substrate on said one or more semiconductor layers, wherein said cover substrate is joined to said transparent substrate at a portion of said one or more non-active regions whereby encapsulating said one or more lacquer layer regions and said one or more semiconductor layers between said cover substrate and said transparent substrate.

9. The method according to claim 8 further comprising depositing one or more electrical contacts on said one or more non-active regions of said transparent substrate.

10. The method according to claim 8, wherein said texturing comprises curing said one or more lacquer layer regions to develop native functional textures in said one or more lacquer layer regions.

11. The method according to claim 8, wherein said texturing comprises:
    imprinting said functional texture on said one or more lacquer layer regions by at least one of ultraviolet embossing, hot embossing, etching, stamping and scribing; and
    curing said one or more lacquer layer regions.

12. The method according to claim 8, wherein a viscosity of a material of said lacquer is between 5 Ns/m$^2$ to 100 Ns/m$^2$ to enable formation of said functional texture.

13. The method according to claim 8, wherein a viscosity of a material of said lacquer is between 10 Ns/m$^2$ to 20 Ns/m$^2$ to enable spraying of lacquer in the form of droplets.

14. The method according to claim 8, wherein said functional texture enables at least one of an internal light extraction and an external light extraction in said semiconductor device.

* * * * *